United States Patent [19]
Golio et al.

[11] Patent Number: 5,220,194
[45] Date of Patent: Jun. 15, 1993

[54] TUNABLE CAPACITOR WITH RF-DC ISOLATION

[75] Inventors: John M. Golio, Chandler; Ronald J. Massey, Mesa; Monte G. Miller, Chandler, all of Ariz.

[73] Assignee: Motorola, Inc., Schaumburg, Ill.

[21] Appl. No.: 697,506

[22] Filed: May 4, 1991

Related U.S. Application Data

[63] Continuation-in-part of Ser. No. 441,748, Nov. 27, 1989, abandoned.

[51] Int. Cl.[5] .......................................... H01L 29/92
[52] U.S. Cl. .................................. 257/601; 257/312; 257/480; 257/595
[58] Field of Search ............. 357/13, 14, 15, 357/22 A, 357/22 I, 22 J, 22 K, 23.14, 22 MD, 52; 333/81 R, 81 A, 262; 257/312, 480, 595, 598, 601

[56] References Cited

U.S. PATENT DOCUMENTS

| | | | |
|---|---|---|---|
| 3,714,522 | 1/1973 | Komiya et al. | 357/30 I |
| 3,737,743 | 6/1973 | Goronkin et al. | 357/15 |
| 4,313,126 | 1/1982 | Krumm et al. | 357/22 |
| 4,322,695 | 3/1982 | Fleming et al. | 333/262 |
| 4,389,660 | 6/1983 | Decker | 357/15 |
| 4,608,583 | 8/1986 | Curtice | 357/15 |
| 4,630,082 | 12/1986 | Sakai | 357/14 |
| 4,709,251 | 11/1987 | Suzuki | 357/15 |
| 4,721,985 | 1/1988 | Pavlidis et al. | 357/15 |
| 4,775,878 | 10/1988 | Inoue et al. | 357/22 I |
| 4,947,142 | 8/1990 | Tayrani | 357/15 |
| 4,947,220 | 8/1990 | Yoder | 357/15 |
| 4,972,237 | 11/1990 | Kawai | 357/15 |
| 4,982,247 | 1/1991 | Aoki et al. | 357/22 J |
| 4,998,147 | 3/1991 | Beckwith et al. | 357/15 |
| 5,001,524 | 3/1991 | Golio et al. | 357/15 |
| 5,019,877 | 5/1991 | Hosogi | 357/15 |
| 5,070,376 | 12/1991 | Shiga | 357/15 |

FOREIGN PATENT DOCUMENTS

| | | | |
|---|---|---|---|
| 51-5965 | 1/1976 | Japan | 357/15 A |
| 53-123086 | 10/1978 | Japan | 357/14 |
| 54-148385 | 11/1979 | Japan | 357/22 K |
| 55-120177 | 9/1980 | Japan | 357/14 |
| 57-202784 | 12/1982 | Japan | 357/15 |
| 59-9971 | 1/1984 | Japan | 357/22 MD |
| 59-104180 | 6/1984 | Japan | 357/14 |
| 59-105341 | 6/1984 | Japan | 357/15 |
| 63-114271 | 5/1988 | Japan | 357/22 A |
| 1-51669 | 2/1989 | Japan | 357/22 A |
| 1-102969 | 4/1989 | Japan | 357/15 |

OTHER PUBLICATIONS

Fleming et al., "GaAs SAMP . . . Switching", IEEE, vol. MTT-27, No. 12, Dec. 1979.

Primary Examiner—Rolf Hille
Assistant Examiner—Minhloan Tran
Attorney, Agent, or Firm—Frederick M. Fliegel; Robert M. Handy; Maurice J. Jones

[57] ABSTRACT

A variable field effect capacitive device suitable for providing different amounts of capacitance in response to control signals of different magnitudes. The device includes a pair of plate electrodes and a pair of control electrodes. A semiconductor region is located between the control electrodes. The plates each make Schottky contact to the semiconductor region to form a depletion region therein which changes shape in response to changes in the magnitude of the control signals.

27 Claims, 5 Drawing Sheets

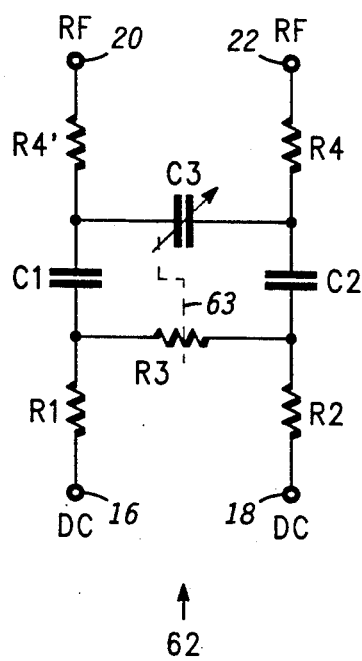
FIG. 4
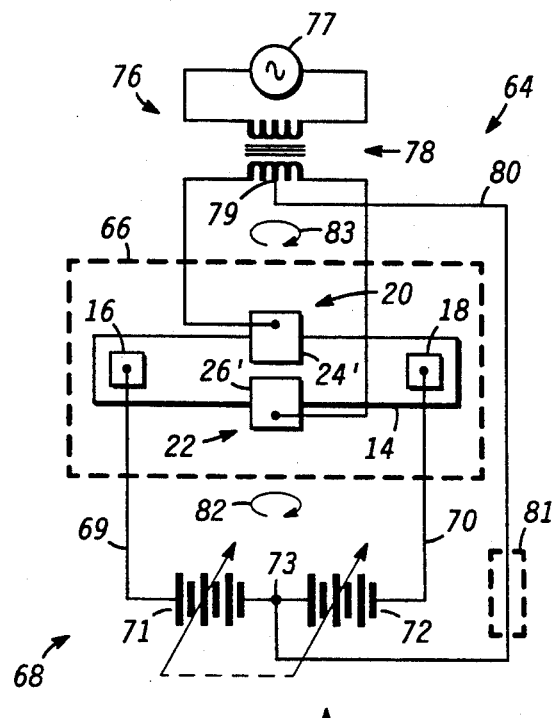
FIG. 5
FIG. 6
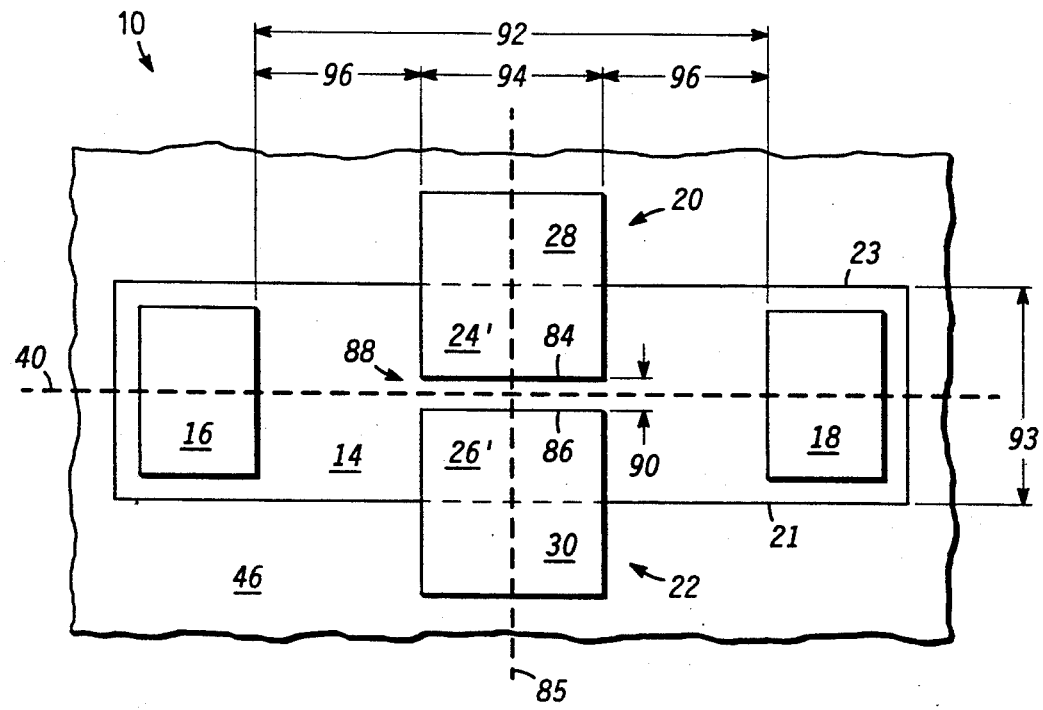

TUNABLE CAPACITOR WITH RF-DC ISOLATION

This application is a continuation-in-part of prior application Ser. No. 07/441,748, filed Nov. 27, 1989, now abandoned.

CROSS REFERENCE TO A RELATED PATENT APPLICATION

The subject matter of the present application is related to the subject matter of a U.S. patent application entitled "DIGITALLY CONTROLLED FIELD EFFECT ATTENUATOR DEVICES" having a filing date of Jun. 5, 1989, and a Ser. No. 361,470, and which is assigned to the same assignee as the present application.

BACKGROUND

The subject invention relates generally to variable capacitance devices and particularly to such devices employing field effect technology which are useful for monolithic microwave integrated circuits (MMICs).

Present day electronic applications often require the utilization of variable capacitive elements which are responsive to control signals to vary the amount of capacitance provided thereby. For example, such variable capacitors are useful for tuning the bandpass characteristics of amplifiers, changing the frequency of Voltage Controlled Oscillators and for adjusting the frequency responses of variable filters.

Prior art, electronically variable capacitive devices generally utilize varactor diodes. These two-terminal devices require a separate network to isolate the direct current (DC) supply from the radio frequency (RF) signal circuitry. Such networks pass DC from the DC supply but block RF from the DC supply and pass RF from the RF supply but block DC from the RF supply. An isolation network usually includes at least a large valued inductor and sometimes a capacitor. Particularly when MMIC circuitry is used, such isolation circuitry is usually prohibitively large and expensive.

A MESFET having the drain and source thereof interconnected is also sometimes utilized particularly in some digital MIMIC applications to provide a variable capacitor. Bias or capacitance control current flows through the source-to-drain channel. Such MESFETs often require an undesirably large amount of current for a given capacitance. These currents tend to undesirably heat up the circuitry and increase the demands on the power supply, for instance. Also, high current MESFETs provide relatively small resistances and thereby provide poor isolation. Thus, these MESFETs also require separate DC/RF isolation components.

SUMMARY OF THE INVENTION

Accordingly, it is an object of the present invention to provide a variable capacitance device enabling isolation of DC and RF signals without requiring a separate network.

A variable field effect capacitive device in accordance with the invention is suitable for providing different amounts of capacitance in response to control signals of different magnitudes. The device includes a pair of plate electrodes and a pair of control electrodes. A semiconductor region is located between the control electrodes. The plates each make Schottky contact to the semiconductor region to form a depletion region therein. The shape of the depletion region changes in response to changes in the magnitude of a control signal applied to the control electrodes to thereby vary the capacitance between the plate electrodes. The depletion region isolates the plate electrodes and the control electrodes to keep the DC bias signals and the RF signals from interfering with each other. The depletion region can extend through the semiconductor material to isolate the control electrodes from each other to thereby reduce current flow and reduce power dissipation.

BRIEF DESCRIPTION OF THE DRAWINGS

A more complete understanding of the present invention may be derived by reference to the detailed description and the claims when considered along with the accompanying drawings wherein like reference numbers designate similar parts.

FIG. 4 is a simplified equivalent circuit of the device of the present invention;

FIG. 5 shows a simplified driving circuit for the device of the present invention;

FIGS. 6–7 and 9 are simplified top views similar to FIG. 1 but according to further embodiments of the present invention.

DETAILED DESCRIPTION OF THE DRAWINGS

Figure 1:
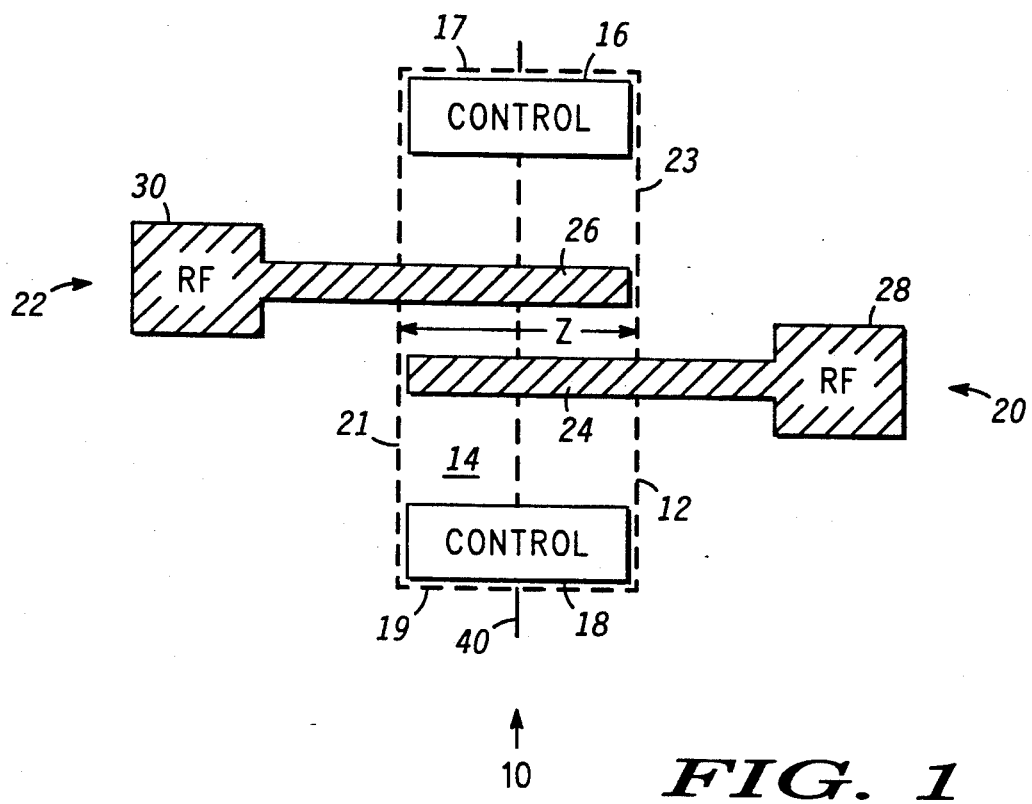
FIG. 1 is a top view of a variable capacitive device structure according to the present invention.

Referring now to the drawings, FIG. 1 shows a top view of a capacitive device 10 which is suitable for being included in MMIC structures. Capacitor 10 can be fabricated by using known depletion mode gallium arsenide (GaAs) MESFET technology. Dashed line 12 surrounds active semiconductor region 14 which has a rectangular configuration having ends 17 and 19 and sides 21 and 23. Bias or capacitance control terminals 16 and 18 are arranged to make ohmic contact with underlying semiconductor active region 14. Terminals 16 and 18 each also have rectangular configurations and are respectively located near ends 17 and 19 of rectangular active semiconductor region 14. RF receiving terminals 20 and 22 respectively include rectangular contact portions or plates 24 and 26 which overlay and make Schottky contact to underlying active semiconductor material 14. Plate 26 extends from side 21 of region 14 and plate 24 extends from side 23 of region 14 between control electrodes 16 and 18. Other RF contact portions 28 of terminal 20 and 30 of terminal 22 each include a square pad for facilitating wire bonds or other connections for applying RF signals to capacitor 10.

Figure 2A:
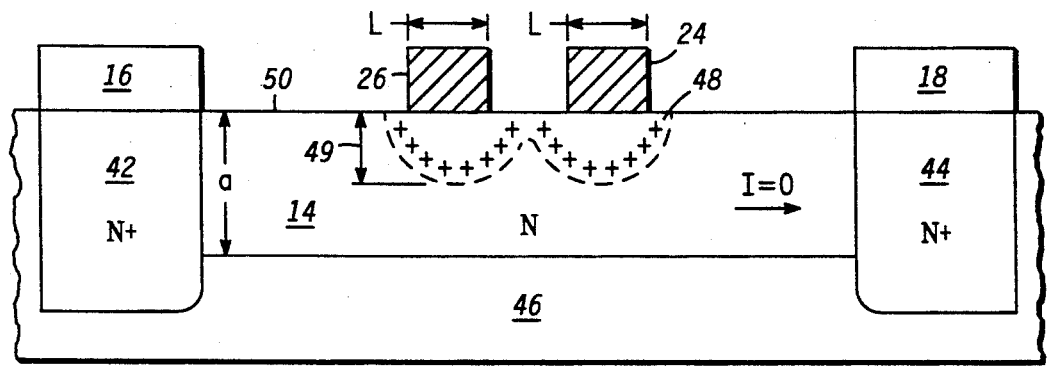
FIGS. 2A, 2B and 2C each indicate a cross section of the capacitive device of FIG. 1.

FIG. 2A shows a cross section of capacitive device 10 taken along dashed line 40 of FIG. 1. N+ regions 42 and 44 are respectively provided beneath control contacts 16 and 18 to facilitate ohmic connection therewith in a known manner. N+ regions 42 and 44 extend through N-type semiconductor material 14 and into semi-insulating layer 46 which forms a substrate for device 10. Schottky plates or electrodes 24 and 26 are provided in a known manner by utilizing the proper combination of such metals as tungsten, gold and titanium. Region 48 underlying contacts 24 and 26 is depleted of available free charges for a distance indicated by measuring arrow 49 by Schottky electrodes 24 and 26. This action takes place because of the differences in the electron affinity of the Schottky metal and semiconductor material 14 at surface 50 of material 14. The resulting depletion region 48, automatically exists at zero bias voltage which produces zero current between terminals 42 and 44. Depletion region 48 tends to isolate bias terminals 16 and 18 from RF terminal portions 24 and 26. The depth 49 of the depletion region can be varied by varying the magnitude of a potential applied to Schottky contacts 24 and 26. The amount of capacitance provided by plates 24 and 26 is affected by the shape of depletion region 48.

If a bias or capacitance control voltage is applied to terminals 16 and 18, then a current will flow between terminals 16 and 18 through semiconductor material 14. This current affects the shape of depletion region 48 and the amount of capacitance provided. As the magnitude of the voltage applied between control terminals 16 and 18 is varied, the current through semiconductor 14 changes to vary the electric field pattern underneath the contacts 24 and 26. This shift causes depletion region 48 to change shape and thus varies the capacitance between contacts 24 and 26. Because N+ regions 42 and 44 are separated from each other by depletion region 48, ohmic conduction between terminals 16 and 18 is reduced by the depletion region 48.

The tunable range of the capacitance provided by capacitor 10 has been estimated using the analysis developed by Pucel, Haus and Statz in an article entitled "Signal Noise Properties of Gallium Arsenide Microwave Filled Effect Transistors",*ADVANCES IN ELECTRONICS AND ELECTRON PHYSICS*, Vol 38, p. 195-265, published 1975. From the work of Pucel et al. an expression for the capacitance, C between Schottky contact portions 24 and 26 is provided as follows:

$$C = 2(eps)Z\left[\frac{L}{a}\left[\frac{1}{1 - I/I_s}\right] + 1.56\right] \quad \text{Equation (1)}$$

where $$I_s = 2aquNZE_s \quad \text{Equation (2)}$$

and (eps)=dielectric constant of semiconductor material 14,

Z=length dimension over which the two Schottky contacts 24 and 26 are closely spaced (see FIG. 1), I=current flowing between the two control contacts 16 and 18, q=electronic charge, $1.6\times10^{-19}$ coulombs, u=low field mobility of semiconductor material 14, N=doping density of the semiconductor material 14, $E_s$=critical field for velocity saturation for semiconductor material 14, and $I_s$=saturation current between control contacts 16 and 18.

The variable L of Equation (1) is the width of each of the RF Schottky contacts 24 and 26 and a of Equation (2) is the depth of active semiconductor 14 from top surface 50 to bottom surface 51, as illustrated in FIG. 2A. FIGS. 2A and 2C show joined depletion regions 48 and FIG. 2B shows joined depletion regions 58.

Figure 3:
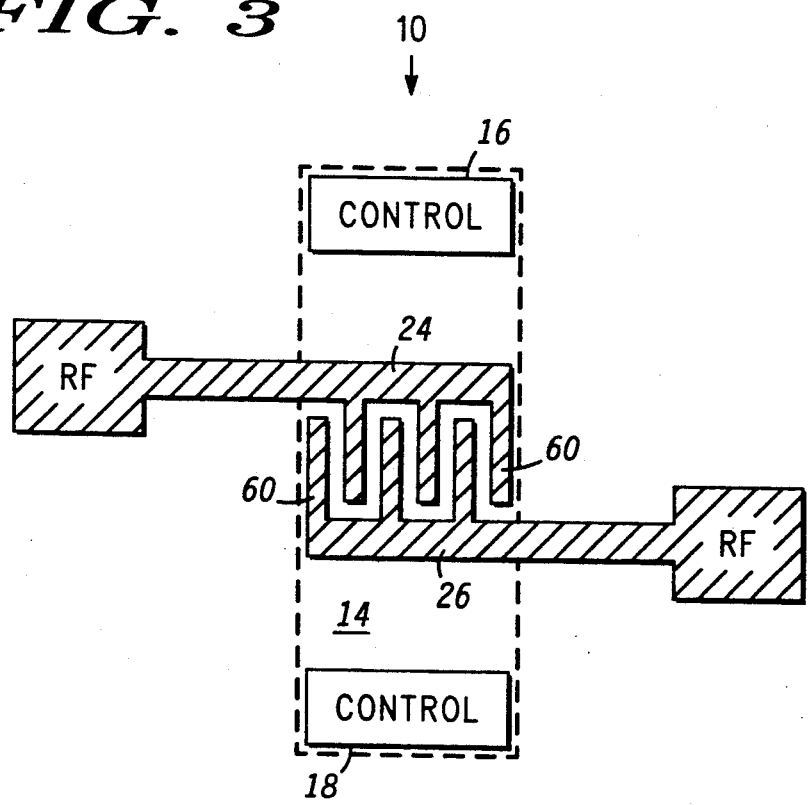
FIG. 3 is a top view of a capacitive device having interdigitated RF electrodes or plates.

In the foregoing expression of Equation (1) for capacitance, C represents the approximate capacitance between Schottky contacts 24 and 26 of FIGS. 1, 2 and 3.

The expression of Equation (1) is valid provided that the dimension L is small and that no DC voltage is applied to the Schottky plates 24 and 26.

Figure 2B:
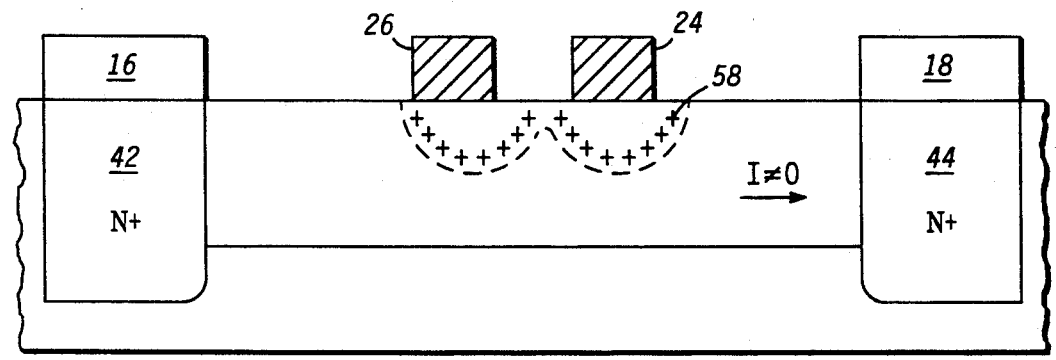
Figure 2C:
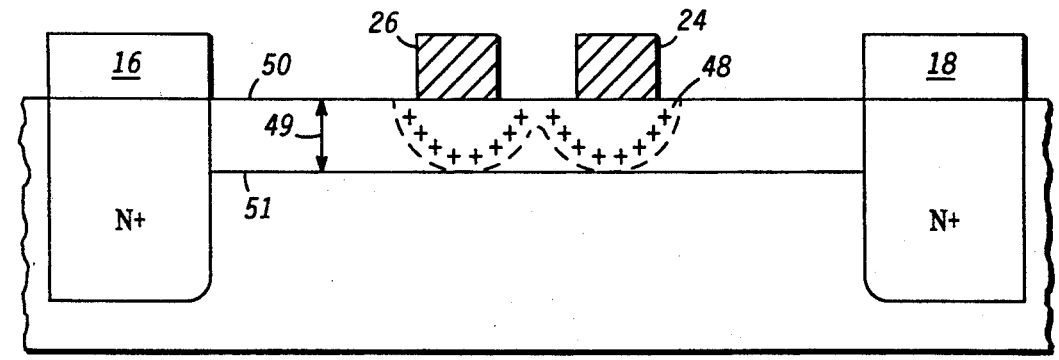

As the bias current between contacts 16 and 18 is increased, the first order volume of depletion region 48 remains basically the same, but the depletion regions change shape and elongate out in the direction of current flow as indicated by region 58 of FIG. 2B. A positive potential on region 16 tends to attract the electrons and a negative potential on region 44 tends to repel electrons to cause the uneven distribution 58 of FIG. 2B. Capacitance is defined as the rate of change of charge with respect to voltage (dq/dv). When the depletion region elongates in response to the increased current between contacts 16 and 18, the new depletion region changes the charge distribution beneath contacts 24 and 26 which changes the rate of change of charge with respect to voltages applied to plates 24 and 26.

As an example of realizable capacitance variations, consider a device described by the following characteristics:

| | |
|---|---|
| N = $10^{17}$ cm$^{-3}$ | u = 4500 cm$^2$/Vsec |
| a = 0.2 micron | $E_s$ = $4_o4$ kV/cm |
| L = 5 microns | Z = 50 microns |

These characteristics are typical of GaAs material and present MMIC processing capabilities. Using these numbers, in Equation (2) $I_s$ is approximately 14.4 milliamps (mA). The current I between the ohmic contacts 16 and 18 of structure 10 can be varied from 0 to about 6.7 mA. Table I presents the resulting capacitance, C as a function of this current, I.

TABLE I

| Capacitance vs. current | |
|---|---|
| I (mA) | C (pF) |
| 0.00 | .303 |
| 1.44 | .335 |
| 2.88 | .375 |
| 4.32 | .426 |
| 5.76 | .494 |
| 6.70 | .552 |

Table 1 shows that device 10 produces a capacitance on the order of 0.4 picofarad (pF) which is turnable over a tuning range of about 1.8 to 1. Greater values of capacitance can be realized by increasing the dimensions Z (FIG. 1) or I (FIG. 2A), or by decreasing the dimension a, as shown by Equations (1) and (2). More particularly, increased capacitance can be realized by increasing the number of fingers, the length of each finger or interdigitating parallel fingers 60 of plate portions 24 and 26 as shown in FIG. 3. Similarly, the tuning range can be expanded by manipulating material properties such as doping density, N.

Two of the critical design goals for device 10 follow:
1) make the capacitance, C between the RF contact portions 24 and 26 much greater than the capacitance between either of DC contacts 16 or 18 and either of the RF contacts 24 or 26 to cause DC-to-RF capacitance to be small compared to the RF capacitance; and
2) minimize the DC power consumption required for tuning capacitor 10.

The first goal can be realized by designing the spacing between plates 24 and 26 of FIG. 1 to be much smaller than the distance between either of these plates and either of DC contacts 16 or 18. As shown in FIG. 2C, the second goal is realized by making the active semiconductor channel depth small so that the built-in potential of the Schottky barrier causes depletion region 48 to extend down to bottom surface 51 of semiconductor material 14 which contacts the top surface of substrate 46. Specifically if depletion region depth 49 is approximately equal to the total active channel depth a and extends laterally along dimension Z across semiconductor region 14, then device 10 will not conduct any appreciable DC current between terminals 16 and 18 thereby reducing the power dissipation thereof. As a result, the capacitive structure 10 of FIG. 2C uses 5 to 10 times less current to provide a given capacitance than would be required in prior art MESFET structures, for instance.

FIG. 4 shows equivalent circuit 62 of device 10. Equivalent circuit 62 comprises DC inputs 16, 18 corresponding to contacts 16, 18 of FIGS. 1-2, coupled by resistors R1, R2, representing the resistance of diffusions 42, 44 and the parasitic resistance of the undepleted portions of region 14 near contacts 16, 18, and resistor R3 representing the resistance of region 14 under and around depletion region 48. Thus, total DC resistance $R_{DC}$ between DC terminals 16, 18 includes the combination of the contact and channel resistances, i.e., $R_{DC}=R1+R2+R3$.

Capacitors C1, C2 represent parasitic capacitance between bias current contacts 16, 18 and RF terminals 20, 22 including Schottky electrodes 24, 26. Resistors R4, R4' represent parasitic resistance of RF electrodes 20, 22 leading to Schottky electrodes 24, 26. Variable capacitor C3 represents capacitance between Schottky electrodes 24, 26 through the depletion regions 48, 58 (see FIGS. 2A through 2C) in semiconductor region 14 created by Schottky electrodes 24, 26. Dashed line 62 connecting variable capacitor C3 and resistor R3 indicates that DC current between contacts 16, 18 through R3 modulates variable capacitor C3, as has been previously described.

For variable capacitance device 10 having the arrangement and dimensions described in connection with FIG. 6, representative values of the equivalent circuit resistance and capacitances are $R_{DC} \sim > 500\Omega$, total RF input resistance $R_{RF}=R4+R4' \sim 19-29\Omega$, $C1+C2 \sim 0.033$ picofarads, and $C4 \sim 0.32-0.53$ picofarads. As has been previously explained, a substantial advantage of the present invention is that the RF portion of the device, e.g., R4'-C4-R4, is substantially isolated from the DC portion of the device, e.g., R1-R2-R3, because capacitances C1, C2 are small and their impedances high compared to the impedances of the RF and DC branches themselves. This provides substantial RF-DC isolation, which is of great practical value.

FIG. 5 shows exemplary circuit 64 in which device 10 is connected to measure or employ the variable capacitance characteristic provided by device 10. The portion of circuit 64 within dashed line 66 corresponds to device 10 and equivalent circuit 62. In the example of FIG. 5, device 10 has the geometry illustrated in FIG. 6, but this is merely for purposes of illustration. So far as circuit 64 is concerned, device 10 may have any of the geometries described herein, as for example but not limited to, the geometries illustrated in FIGS. 1, 2, 6 and/or 7.

Circuit 64 comprises device 10 having DC current contacts 16, 18 and AC contacts 28, 30 (FIG. 6, infra) connected to Schottky electrodes 24', 26'. Electrodes 24', 26' are analogous to electrodes 24, 26. DC current is provided to control contacts 16, 18 by battery or power supply 68. Power supply 68 is coupled to contacts 16, 18 by connection 69, 70. Power supply 68 is desirably variable, as indicated by the arrows thereon. Power supply 68 is desirably split into two portions 71, 72 with center node 73.

AC (e.g., RF) source 76 is coupled to AC input terminals 20, 22 of device 10 which couple the AC signal to Schottky electrodes 24', 26'. This is conveniently accomplished by means of RF generator 77 driving center tapped transformer, Balun or transmission line segment 78 which is coupled to RF terminals 20, 22. RF source 77 typically operates in the range of 1-16 Gigahertz. Center tap 79 is conveniently returned to center node 73 of DC source 68 be connection line 80. RF source 76 may be capacitively coupled to terminals 20, 22.

As has been previously explained, it is not necessary to provide any DC bias between power supply 68 and Schottky electrodes 28, 30 for device 10 to exhibit variable capacitance properties, although such DC voltage bias is not precluded. If such DC bias is desired between nodes 73 and 79, it is conveniently provided by optional DC voltage source 81 inserted in line 80. The DC bias provided by voltage source 81 increases or decreases the average width and volume of depletion layer 48 in semiconductor region 14. However, such external DC bias is not necessary since depletion layer 48 exists at zero external bias due to the built-in contact potential between Schottky electrodes 24, 26 arising from the electron affinity difference between electrodes 24, 26 and semiconductor region 14, as has previously been explained.

Coupling center tap 79 to center node 73 of DC source 68 insures that the external DC bias between Schottky electrodes 24, 26 and semiconductor region 14 is substantially zero (unless an external bias element 81 is provided in line 80) independent of control current 82 flowing from DC source 68 through contacts 16, 18. Thus, the primary action of control current 82 is to change the shape rather than the average width or volume of depletion region 48.

As has been previously described, control current 82 flowing between terminals 16, 18 determines the effective size of variable capacitor C3 in equivalent circuit 62 of FIG. 4. As control current 82 is changed, the impedance of capacitor C3 changes and so does the amount of RF current 83 flowing through AC electrodes 20, 22.

While circuit 64 is shown as comprising simple RF generator 76 and DC bias current generator 68, those of skill in the art will understand that this is merely for purposes of explanation. Device 10 provides capacitance variation which is determined by changes in bias current 82, and this capacitance variation may be used for any purpose desired. Non-limiting examples are, tuning, modulation, impedance matching and compensation.

Also, while current 82 has been described as being a substantially DC current, those of skill in the art will understand that device 10 is most useful when current 82 is varied to achieve some control or modulation or compensation or other function requiring a controllably variable capacitance. For example, device 10 may be used as a modulator by supplying RF current 83 to electrodes 20, 22 and lower frequency varying current 82 to control contacts 16, 18. RF current 83 will be amplitude modulated by varying control current 82. As used herein with respect to control current 82, the words "direct current" and the abbreviation "DC" are intended to encompass both steady and varying signals. In general, the rate of variation of DC control current 82 will be much less than the frequency of RF current 83.

FIG. 6 is similar to FIG. 1 and illustrates a further embodiment of the invention. Schottky electrodes 24', 26' are analogous in function to electrodes 24, 26 of FIG. 1. The device of FIG. 6 differs from that of FIG. 1 in that electrodes 24', 26' have common transverse center line 85, rather than having different transverse center lines spaced-apart along longitudinal center line 40 as do electrodes 24, 26. Further, electrodes 24', 26' do not run across active semiconductor region 14 substantially from side 21, to side 23, as do electrodes 24, 26. Each electrode 24', 26' extends only part way across region 14. Facing ends 84, 86 of electrodes 24', 26' are substantially parallel and separated by small gap 88 of width 90. Gap 88 is conveniently symmetrical about longitudinal center line 40, but this is not essential. In general, it may be located anywhere within region 14, but should be spaced well away from ohmic contacts 16, 18.

Figure 7:
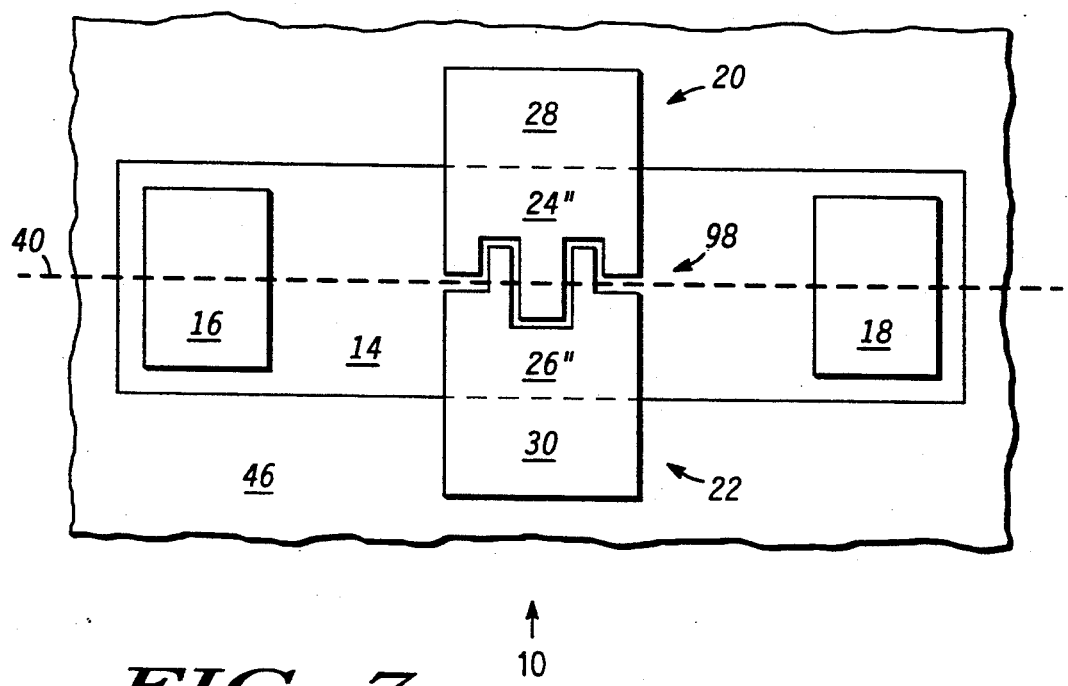

Typical dimensions of the device of FIGS. 6-7 are: length 92 of active semiconductor region 14 of about 200 micrometers, width 93 of active semiconductor region 14 of about 5-20 micrometers, Schottky electrode width 94 over region 14 of about 50-100 micrometers, Schottky electrode spacing 96 from ohmic contacts 16, 18 of about 50-75 micrometers and gap width 90 between Schottky electrodes 24', 26' of about 1 micrometer, although larger and smaller values may also be used. As has been previously explained, it is important that gap 88 be as small as possible and electrode spacing 96 be much larger than gap width 90.

It has been found that the arrangement of FIG. 6 in which Schottky electrodes 24', 26' have common transverse center line 85 and do not each extend substantially across semiconductor region 14 and in which the long dimension of gap 88 is parallel rather than perpendicular to sides 21, 23 and longitudinal center line 40, gives improved performance as compared to the arrangement of FIG. 1 in which electrodes 24, 26 each extend substantially across region 14 between sides 21, 23 and in which the long dimension of inter-electrode gap is transverse to center line 40.

FIG. 7 is a simplified top view of a further embodiment of the present invention. FIG. 7 is similar to FIG. 6, except that Schottky electrodes 24'', 26'' (analogous to electrodes 24' and 26') are interdigitated with interdigitations 98 turned at ninety degrees as compared to those of FIG. 3.

Figure 8:
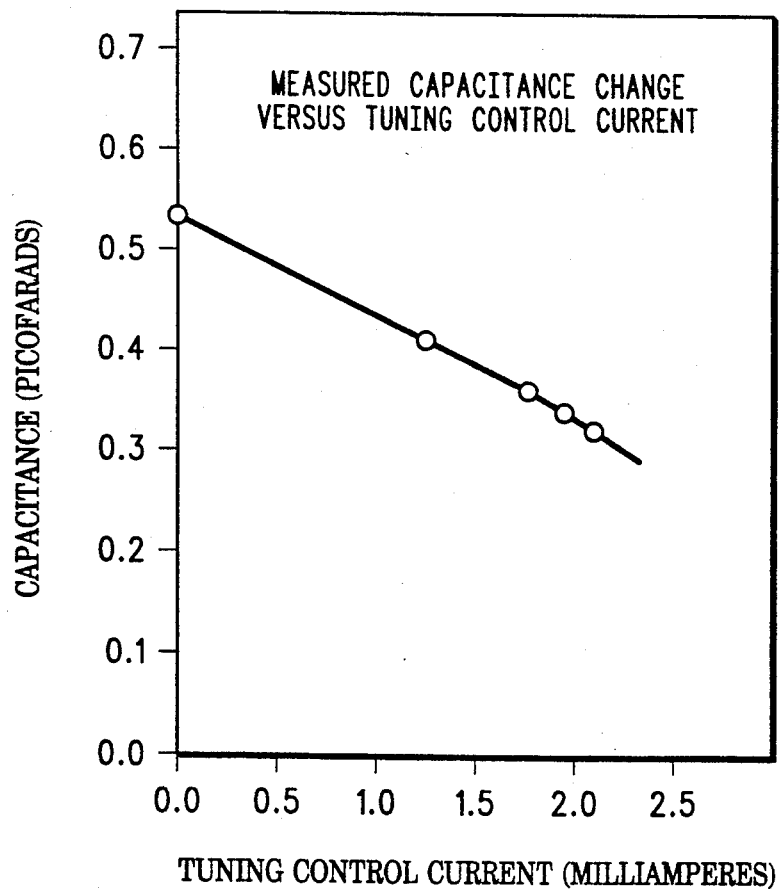
FIG. 8 is a plot of capacitance versus control current for an exemplary device of the present invention.

FIG. 8 shows a plot of capacitance in picofarads versus control current 82 in milliamperes for a device corresponding to FIG. 6 and having dimensions as previously described in connection with FIG. 6. Unlike the behavior of the device of FIG. 1 in which the capacitance increases as a function of increasing control current (see Table I), with the device of FIG. 6, the capacitance decreases with increasing control current. In addition, the control current change required to produce a given capacitance change is much less. For example, taking the initial and final values from Table I gives an average capacitance change $\Delta C/\Delta I = +0.037$ pf/mA, while taking the initial and final values from FIG. 8, gives $\Delta C/\Delta I = -0.1$ pf/mA. The capacitance change for a given control current change is about three times higher with the arrangement of FIG. 6. It is unexpected that $\Delta C/\Delta I$ is negative.

While FIGS. 1 through 7 are shown as employing two Schottky electrodes on semiconductor region 14, more than two Schottky contacts can also be employed. That is, one or more additional Schottky electrodes corresponding to either or both of 20, 22 may be included, by extending the distance between contacts 16, 18 and adding such additional Schottky electrode or electrodes therebetween. As has been previously taught for the two electrode system, the gap separating the further Schottky electrodes whose interelectrode capacitance is desired to be varied should be smaller than the spacing between such additional electrodes and the ohmic contacts, so as to maximize the variable capacitance compared to the static parasitic capacitance. In general, where three or more Schottky electrodes are used, the separation of the Schottky electrodes desired to have current controlled variable capacitance should be such that the depletion regions formed thereunder overlap as illustrated in FIGS. 2A-C.

Figure 9:
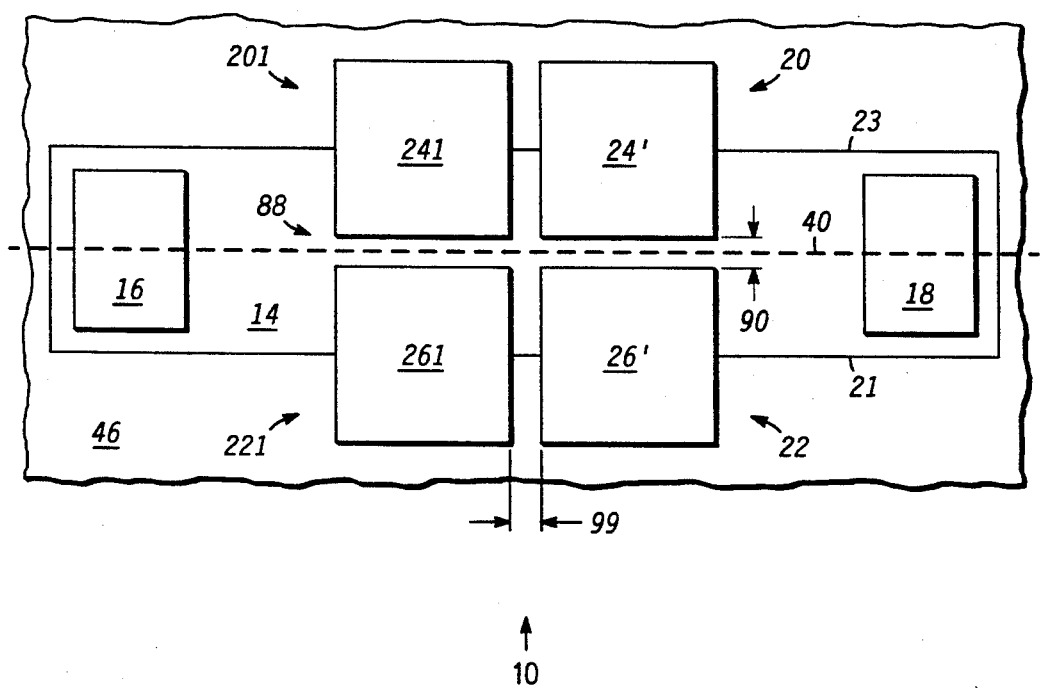

FIG. 9 illustrates an arrangement similar to FIG. 6 but where two pairs of AC electrodes 20, 22 and 201, 221 having Schottky pairs 24', 26' and 241, 261 separated by gap 99 are used, each pair having overlapping depletion regions in gaps 88. If the Schottky electrode pairs 24', 26' and 241, 261 are close together, i.e., gap 99 is small, the depletion regions of all four electrodes will overlap and DC current controlled variable capacitance will exist between pairs 24', 26' and 241, 261 across gap 99 as well as between the members of the pairs themselves across gaps 88. This variable capacitance is controlled by current 82 flowing between control contacts 16, 18 (FIG. 5).

Conversely, if gap 99 is large so that pairs 24', 26' and 241, 261 are well spaced apart and the depletion region associated with one pair does not overlap the depletion region associated with the other pair, then there will be much reduced variable capacitance between the pairs and the pairs will be effectively AC and DC isolated from each other, even though the AC capacitance within each Schottky electrode pair is controlled by a common DC control current directed between ohmic contacts 16, 18.

Thus, a tunable capacitor 10 for MMIC applications has been described. Capacitor 10 can tune the impedance of microwave circuits after fabrication has been completed, for example. Capacitor 10 provides control contacts 16 and 18 for performing this tuning operation. Control contacts 16 and 18 are isolated from RF plate electrodes 24 and 26. The structure of capacitor 10 is realized in a small amount of space compared to other embodiments such as those utilizing varactors or MESFETs which require additional, bulky isolation circuitry. Moreover, capacitive structure 10 permits the impedance variation normally caused by manufacturing variations to be easily compensated for by adjusting the control bias applied to terminals 16 and 18.

Capacitor 10 can be used to provide temperature compensation in MMIC circuitry, for instance. More specifically, RF amplifier frequency responses tend to change with temperature change. For example, the power gain of such amplifiers tends to fall off with increased temperatures. Therefore, by using tunable capacitive structure 10 in the output of such RF amplifiers, the gain characteristic of the amplifier can be compensated over temperature. Specifically, thermocouples can be used to sense the temperature to generate a control voltage that is temperature sensitive which is applied to the bias or control terminals 16 and 18 of capacitor 10 to change the capacitance between plates 24 and 26 thereof in a desired manner to thereby provide different capacitance to RF signals applied to pads 28 and 30.

While the present invention has been particularly shown and described with reference to the preferred embodiments, those skilled in the art will understand that changes in form and detail may occur therein without departing from the scope of the present invention.

We claim:

1. A variable capacitance element, comprising:

a semiconductor region having thereon first and second direct current contacts spaced apart by a first distance; and at least two spaced-apart alternating current electrodes overlying a portion of said semiconductor region and forming a common depletion region therein located between said direct current contacts and spaced therefrom by a second distance of at least two-fifths of said first distance, said common depletion region extending continuously from a first side of said semiconductor region to a second side thereof, wherein said at least two alternating current electrodes are separated by a third distance less than said second distance, wherein said at least two spaced-apart alternating current electrodes exhibit varying capacitance therebetween in response to a varying direct current flowing between said first and second direct current contacts.

2. The element of claim 1, wherein said third distance is such compared to said second distance that capacitance between said alternating current electrodes is much larger than capacitance between said alternating current electrodes and said first and second direct current contacts.

3. The element of claim 1, wherein said at least two spaced-apart alternating current electrodes form a gap therebetween of width equal said third distance and of a length equal a fourth distance greater than said third distance.

4. The element of claim 3, wherein said length is oriented parallel to a line running from said first direct current contact to said second direct current contact.

5. The element of claim 3, wherein said third distance is approximately one micrometer and said fourth distance is approximately in a range of from fifty to one hundred micrometers.

6. The element of claim 1, further comprising at least two further alternating current electrodes similar to said at least two spaced-apart alternating current electrodes but spaced therefrom between said direct current contacts.

7. An electronic device, comprising:

a variable capacitance element comprising a semiconductor region having thereon spaced apart direct current contacts and at least two spaced-apart alternating current electrodes overlying a portion of said semiconductor region and forming interconnected depletion regions therein located between said direct current contacts and spaced therefrom, wherein said alternating current electrodes exhibit varying capacitance therebetween in response to a varying direct current flowing between said direct current contacts;

RF signal means for exciting said alternating current electrodes and producing an RF current which varies in response to said varying capacitance; and DC signal means for providing a control current between said direct current contacts for varying capacitance between said alternating current electrodes.

8. The element of claim 7, wherein said DC signal means and said RF signal means are interconnected such that variations in said control current produce no substantial change in DC potential between said RF signal means and said DC signal means.

9. The element of claim 7, wherein changes in said control current produce no substantial change in DC potential between said alternating current electrodes and a portion of said semiconductor region thereunder.

10. An electronic device, comprising:

a body having a semiconductor region of a predetermined conductivity type disposed therein;

at least two input/output electrodes spaced apart by a first distance, each input/output electrode making rectifying contact to said semiconductor region, said input/output electrodes exhibiting an AC input-to-output capacitance therebetween; and at least two control electrodes spaced apart by a second distance, each control electrode making ohmic contact to said semiconductor region, wherein said input/output electrodes lie between said control electrodes and exhibit an AC input-/output-to-control electrode capacitance which is less than said AC input-to-output capacitance, and wherein said AC input-to-output capacitance varies in response to variations in a control current flowing between said control electrodes.

11. The device of claim 10, wherein said first distance is less than said second distance.

12. The device of claim 10, wherein:

said semiconductor region has opposed first and second sides extending substantially between said control electrodes; and said input/output electrodes comprise:

(i) an input electrode having at least one input finger extending from said first side toward said second side; and (ii) an output electrode having at least one output finger extending from said second side toward said first side, until facing ends of said input and said output fingers are separated by a gap of width equal to said first distance, said gap having a length measured substantially along a line lying centrally within said gap, said length exceeding said width.

13. The device of claim 12, wherein said gap is approximately one micrometer in width.

14. The device of claim 10, wherein said input/output electrodes comprise at least a first Schottky contact and a second Schottky contact.

15. The device of claim 14, wherein said first distance is such that a first depletion region formed by said first Schottky contact is joined with a second depletion region formed by said second Schottky contact.

16. The device of claim 14, wherein:

said semiconductor region has a substantially rectangular shape with opposed ends connected by opposed sides;

said control electrodes are located adjacent said opposed ends; and said input/output electrodes extend substantially between said opposed sides.

17. The device of claim 14, wherein:
said semiconductor region has an exposed top surface, a bottom surface, opposed sides and first and second ends, said first and second ends being opposed;
a first of said control electrodes being located substantially adjacent said first end;
a second of said control electrodes being located substantially adjacent said second end;
said input/output electrodes comprising:
   a first input/output electrode extending inwardly from a first of said opposed sides and having a first depletion region; and
   a second input/output electrode extending inwardly from a second of said opposed sides and having a second depletion region;
   said first depletion region and said second depletion region combining to form a joined depletion region; and
   said joined depletion region extending substantially from said top surface to said bottom surface.

18. The device of claim 14, wherein:
said input/output electrodes include a plurality of input electrode fingers and a plurality of output electrode fingers, said input electrode fingers being interdigitated with said output electrode fingers.

19. The device of claim 14, wherein:
said semiconductor region has opposed first and second sides extending substantially from a first of said control electrodes to a second of said control electrodes; and
said at least two input/output electrodes comprise:
   (i) an input electrode having at least one input finger extending from said first side toward said second side; and
   (ii) an output electrode having at least one output finger extending from said second side toward said first side, until facing ends of said input and said output fingers are separated by a gap of width equal to said first distance, said gap having a length measured substantially along a line lying centrally within said gap, said length exceeding said width.

20. The device of claim 19, wherein said gap has a serpentine shape.

21. A monolithic variable capacitance device, comprising:
a semiconductor region;
first and second ohmic contacts to said semiconductor region, spaced apart by a first distance;
first and second Schottky contacts to said semiconductor region, said first and second Schottky contacts spaced apart by a second distance and exhibiting a first capacitance therebetween;
said first and second Schottky contacts lie between said first and second ohmic contacts and exhibit a second capacitance to said first and second ohmic contacts, said second capacitance being less than said first capacitance; and
said first capacitance varying in response to variations in a control current flowing between said first and second ohmic contacts.

22. The device of claim 21, wherein:
said semiconductor region has top and bottom surfaces and first and second sides;
said first Schottky contact extends inwardly from said first side;
said second Schottky contact extends inwardly from said second side;
said first and second Schottky contacts have facing ends located adjacent a centrally located line extending in a direction from said first ohmic contact to said second ohmic contact; and
said facing ends are separated by a gap of width equal said second distance.

23. The device of claim 22, wherein:
said first Schottky contact forms a first depletion region;
said second Schottky contact forms a second depletion region; and
said first and said second depletion regions intersect to form intersecting depletion regions.

24. The device of claim 23, wherein a portion of said intersecting depletion regions extends substantially from said top surface to said bottom surface of said semiconductor region.

25. The device of claim 24, wherein a portion of said intersecting depletion regions extends substantially from said top surface to said bottom surface and from said first side to said second side of said semiconductor region.

26. The device of claim 23, wherein said intersecting depletion regions change shape in response to changes in said control current flowing between said first and second ohmic contacts.

27. The device of claim 21, wherein said second distance is less than said first distance.

* * * * *